United States Patent
Smith et al.

(10) Patent No.: US 6,556,361 B1
(45) Date of Patent: Apr. 29, 2003

(54) PROJECTION IMAGING SYSTEM WITH A NON-CIRCULAR APERTURE AND A METHOD THEREOF

(75) Inventors: Bruce W. Smith, Webster, NY (US); John S. Petersen, Austin, TX (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 09/528,272

(22) Filed: Mar. 17, 2000

Related U.S. Application Data (60) Provisional application No. 60/124,830, filed on Mar. 17, 1999.

(51) Int. Cl.[7] ............ G02B 9/08; G02B 27/10; G03B 27/68; G01B 11/00
(52) U.S. Cl. ............ 359/738; 359/618; 359/638; 355/52; 356/401
(58) Field of Search .................. 359/618, 738, 359/638, 639, 640; 355/52, 53, 61; 356/401

(56) References Cited

U.S. PATENT DOCUMENTS

| | | | |
|---|---|---|---|
| 5,363,172 A | * 11/1994 | Tokuda | 355/71 |
| 5,534,970 A | 7/1996 | Nakashima et al. | 355/53 |
| 5,576,801 A | 11/1996 | Ushida et al. | 355/53 |
| 5,805,290 A | * 9/1998 | Ausschnitt et al. | 356/401 |
| 6,002,467 A | 12/1999 | Nishi et al. | 355/61 |
| 6,078,380 A | 6/2000 | Taniguchi et al. | 355/52 |
| 6,133,986 A | * 10/2000 | Johnson | 355/67 |
| 6,175,405 B1 | * 1/2001 | Kawai | 355/67 |
| 2002/0021424 A1 | * 2/2002 | Tokuda et al. | 355/53 |

OTHER PUBLICATIONS

B. W. Smith and J. S. Petersen, "Influence of off–axis illumination on optical lens aberration," *J. Vac. Sci Technol. B*, 16:6, 3405–3410 (1998).
B. W. Smith, "Variations to the influence of lens aberration invoked with PSM and OAI," *Proc. SPIE Optical Microlithography XI*, 3679–3731 (1999).
B. W. Smith, L. Zavyalova, J. S. Petersen, "Illumination pupil filtering using modified quadrupole apertures," *Proc. SPIE Optical Microlithography XI*, 3334–3337 (1998).

* cited by examiner

Primary Examiner—Evelyn A Lester
Assistant Examiner—Tim Thompson
(74) Attorney, Agent, or Firm—Nixon Peabody LLP (57) ABSTRACT

A imaging tool for use with a mask with features oriented along at least an x-axis or a y-axis where the x-axis extends in directions substantially perpendicular to the directions of the y-axis. The tool has a condenser lens with a condenser plate which is located in a condenser lens pupil plane and which has a condenser aperture with four-sides. The sides of the condenser aperture are oriented in substantially the same direction as either the x-axis or the y-axis. The condenser lens is positioned to place at least a portion of any illumination on at least a portion of the mask.

24 Claims, 7 Drawing Sheets

PROJECTION IMAGING SYSTEM WITH A NON-CIRCULAR APERTURE AND A METHOD THEREOF

This application claims the benefit of U.S. Provisional Patent Application Serial No. 60/124,830 filed on Mar. 17, 1999 which is herein incorporated by reference.

FIELD OF THE INVENTION

This invention relates generally to projection imaging systems for optical lithography. More particularly, this invention is utilized in an optical lithographic exposure tool to improve the imaging performance through focus of features oriented along x and y axes or directions.

BACKGROUND OF THE INVENTION

Conventionlal projection imaging tools utilize circular apertures in both the objective lens and condenser lens systems allowing for equivalent imaging of features oriented in any direction. The objective lens has the ability to collect a finite amount of diffracted information from a mask, determined by its maximum acceptance angle or numerical aperture (NA). By limiting high frequency diffraction components, the lens acts as a low pass filter blocking information propagating at angles beyond its capability. Information that is passed is acted on by the lens to produce a second inverse Fourier transform operation, directing a limited reconstruction of the mask object toward the image plane. Depth of focus (DOF) is also a consideration when determining the capabilities of an optical imaging system. Depth of focus is defined as the distance along the optical axis $$DOF=+/-k_2 \lambda/NA^2,$$

that produces an image of some suitable quality. The Rayleigh depth of focus generally takes the form: where $k_2$ is a process dependent factor. For a resist material of reasonably high contrast, $k_2$ may be on the order of 0.5. DOF decreases linearly with wavelength and as the square of numerical aperture. Depth of focus is closely related to defocus, the distance along the optical axis from a best focus position. The acceptable level of defocus for a lens system will determine the usable DOF. Tolerable levels of this aberration will ultimately be determined by the entire imaging system as well as the feature sizes of interest.

For the situation described, coherent illumination allows for simplification of optical behavior. Diffraction at a mask is effectively a Fourier transform operation. Part of this diffracted field is collected by the objective lens, where diffraction is in a sense "reversed" through a second Fourier transform operation.

Partial coherence can be thought of as taking an incoherent sum of coherent images. For every point within a source of finite extent, a coherent Fraunhofer diffraction pattern is produced. For a point source on axis, diffracted information is distributed symmetrically and discretely about the axis. For off axis points, diffraction patterns are shifted off axis and, as all points are considered together, the resulting diffraction pattern becomes a summation of each individual distribution. The zeroth order is centered on axis, but with a width>0, a result of the extent of partially coherent illumination angles. Similarly, each higher diffraction order also has width>0, an effective spreading of discrete orders.

The impact of partial coherence is realized when the influence of an objective lens is considered. By spreading the diffraction orders around their discrete coherent frequencies, operation on the diffracted information by the lens produces a frequency averaging effect of the image and loss of image modulation. This image degradation is not desirable when coherent illumination would allow for superior image reconstruction. If, however, a situation exists where coherent illumination of a given mask pattern does not allow for lens collection of diffraction orders beyond the zeroth order, partially coherent illumination would be preferred.

Consider a coherently illuminated rectangular grating mask where +/− first diffraction orders fall just outside a projection systems lens NA. With coherent illumination, imaging is not possible as feature sizes fall below the R=0.5 λ/NA limit. Through use of partial coherent illumination, partial first diffraction order information can be captured by the lens, resulting in imaging capability. Partial coherent illumination, therefor, is desirable as mask features fall below R=0.5 λ/NA in size. An optimum degree of coherence can be determined for a feature based on its size, the illumination wavelength, and the objective lens NA.

Figure 1:
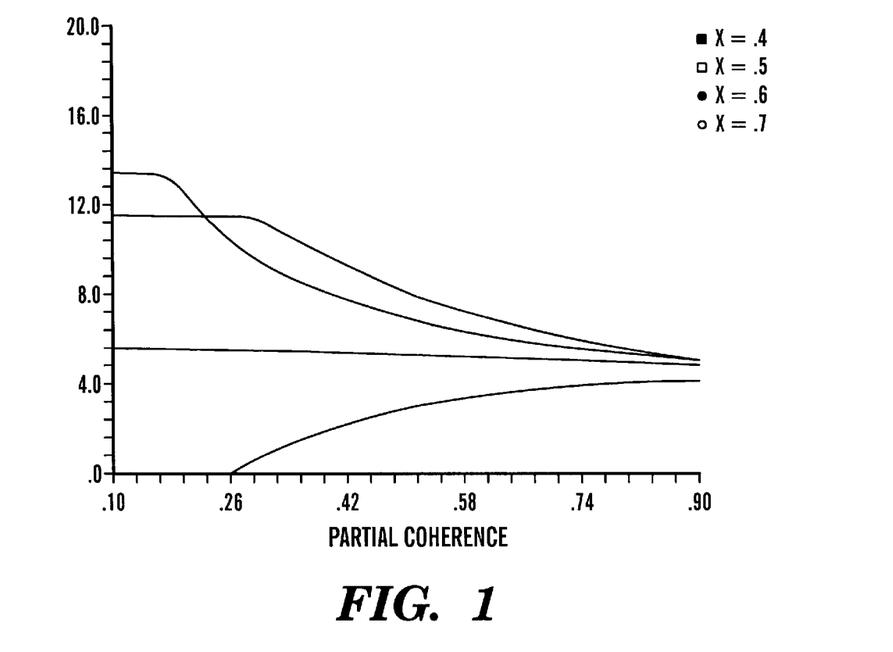
FIG. 1 is a graph of an image log slope versus partial coherence for dense features from 0.4 λ/NA to 0.6 λ/NA.

Referring to FIG. 1, a graph of image log slope vs. partial coherence plot for features of size R=0.4 λ/NA to 0.6 λ/NA shows how partial coherence impacts imaging through measurement of the aerial image log-slope or ILS. This metric measures the slope of the log of the intensity image produced by the imaging system where larger values correspond to an increase in image fidelity. Changes in this log aerial image gradient directly influence resist profile and process latitude. As this graph illustrates, for increasing levels of partial coherence, image log slope increases for features smaller than 0.5 λ/NA and decreases for features larger than 0.5 λ/NA.

Figure 2:
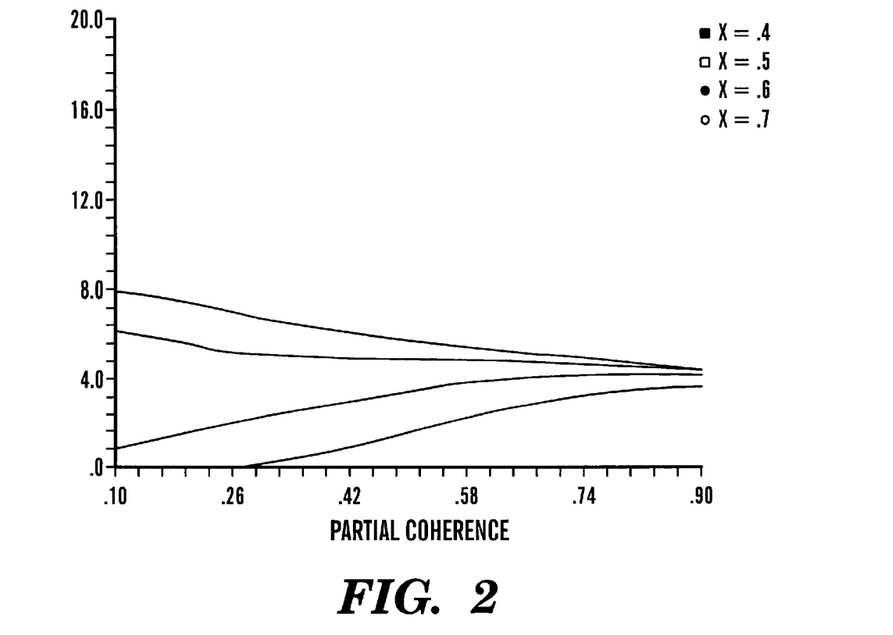
FIG. 2 is a graph of image log slope versus partial coherence for dense features from 0.4 λ/NA to 0.6 λ/NA with 0.5 $\lambda/NA^2$ of defocus.

For evaluation of DOF using partial coherence, the distribution of diffraction orders needs to be considered. For coherent illumination, there is a discrete difference in optical path length traveled between diffraction orders. By using partial coherence, however there is an averaging effect of the optical path over the lens pupil. By distributing frequency information over a broad portion of the lens pupil, the differences in path lengths experienced between diffraction orders is reduced. In the limit for complete incoherence, the zero and first diffraction orders essentially share a similar pupil area, significantly reducing the effects of defocus. This can be seen in FIG. 2, which is similar to FIG. 1 except a large defocus value has been incorporated. This graph in FIG. 2 shows that at low partial coherence values, ILS is reduced. At high partial coherence levels, however, ILS remains high indicating a greater DOF is possible.

SUMMARY OF THE INVENTION

A imaging tool for use with a mask with features oriented along at least an x-axis or a y-axis where the x-axis extends in directions substantially perpendicular to the directions of the y-axis in accordance with one embodiment of the present invention includes an objective lens. The condenser lens has a condenser aperture with four-sides that are located in a condenser lens pupil plane. The sides of the condenser aperture are oriented in substantially the same direction as either the x-axis or the y-axis. The condenser lens is positioned to place at least a portion of illumination on at least a portion of the mask.

A projection imaging system in accordance with another embodiment of the present invention includes a mask, a condenser lens, and an illuminator. The mask has features oriented along at least an x-axis or a y-axis. The x-axis extends in directions substantially perpendicular to the directions of the y-axis. The condenser lens has a condenser plate with a condenser aperture with four-sides which is located in a condenser lens pupil plane. The sides of the condenser aperture are oriented in substantially the same direction as either the x-axis or the y-axis. The illuminator is positioned to illuminate at least a portion of the condenser lens. The condenser lens is positioned to place at least a portion of the illumination on to at least a portion of the mask.

A method for lithography in accordance with another embodiment of the present invention includes a few steps. First, at least a portion of a mask is illuminated onto a condenser lens pupil plane of a condenser lens. The mask has features oriented along at least an x-axis or y-axis with the x-axis extending in directions substantially perpendicular to the directions of the y-axis. The condenser lens has a condenser aperture located in the condenser lens pupil plane. The condenser aperture has four-sides with each of the sides oriented in substantially the same direction as either the x-axis or the y-axis. Next, the illumination passing through the condenser aperture in the condenser lens pupil plane is directed on to at least a portion of the mask.

The present invention provides a number of advantages including improving imaging for lithography, particularly for integrated circuit designs whose feature are primarily oriented in either an X-axis and/or Y-axis directions. The present invention produces noticeable improvements over imaging tools and systems with circular apertures in terms of resolution and focal depth.

DETAILED DESCRIPTION

Figure 3A:
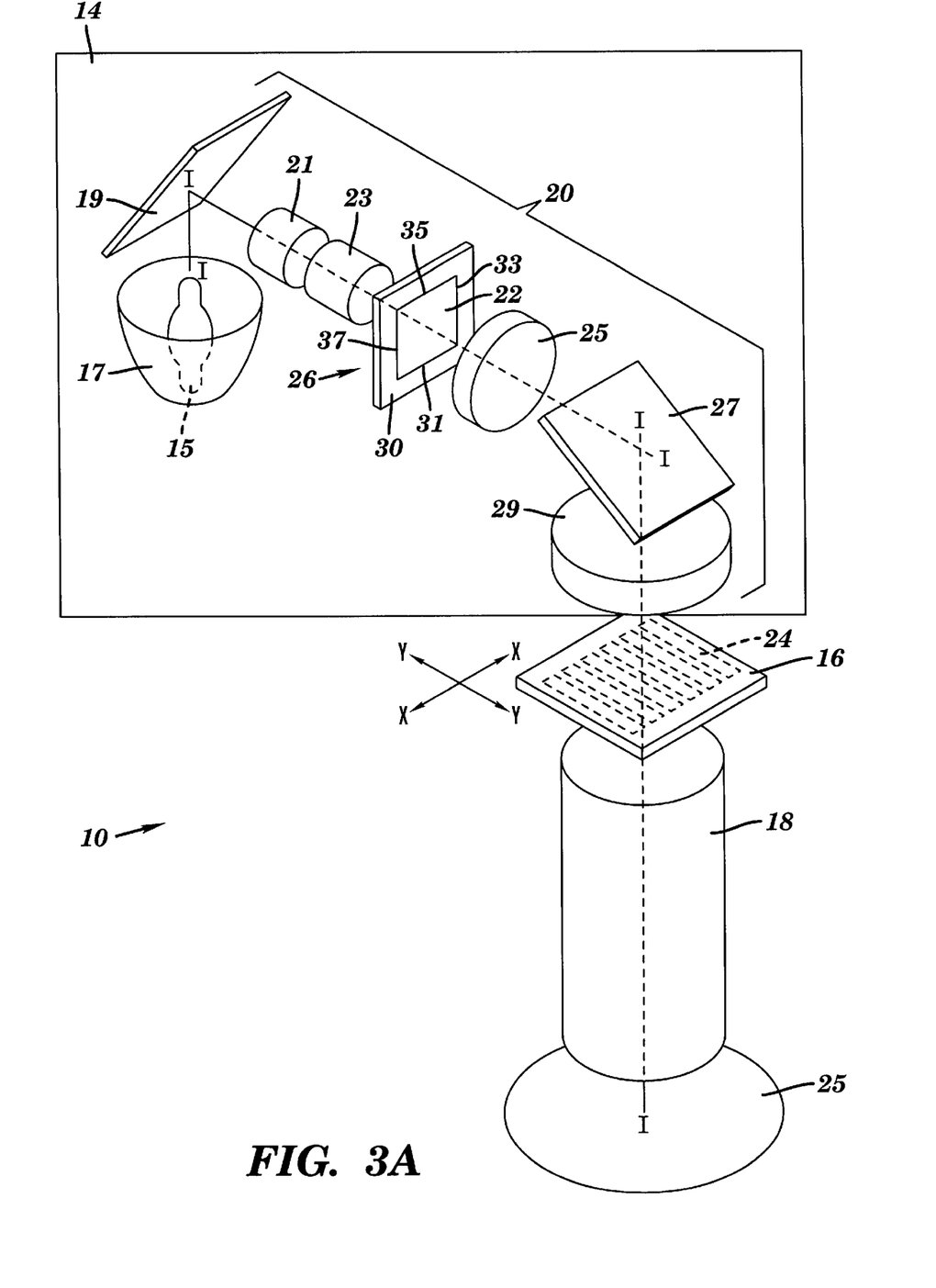
FIG. 3A is a block diagram of a projection imaging system in accordance with one embodiment of the present invention.

A projection imaging system or tool 10 in accordance with one embodiment of the present invention is illustrated in FIG. 3A. The projection imaging system 10 includes an illumination system 14, a mask 16, an objective lens 18, and a condenser lens 20 having an aperture plate 30 with an aperture 22 with four-sides where sides 31 and 35 are oriented in substantially the same direction as or substantially parallel to an x-axis (which is identified as X—X in FIG. 3A) and sides 33 and 37 are oriented in substantially the same direction as or substantially parallel to a y-axis (which is identified as Y—Y in FIG. 3A). The projection imaging system 10 provides a number of advantages including performance improvements over circular shaped apertures in terms of resolution and focal depth.

Figure 3B:
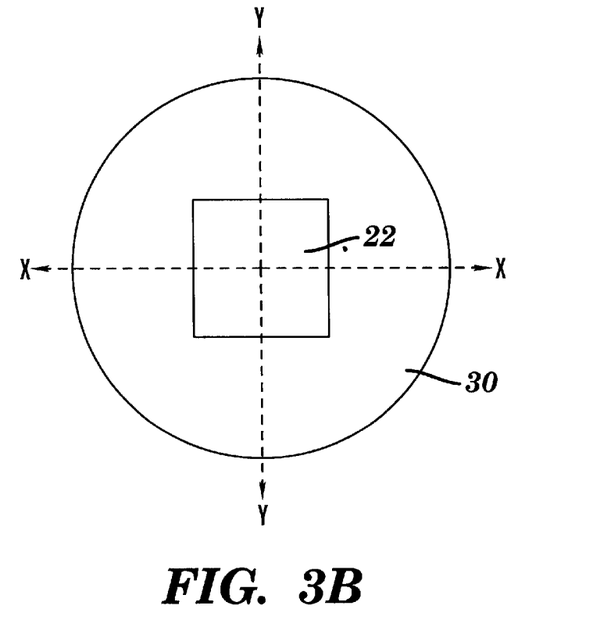
FIG. 3B is a front view of a condenser plate with a square shaped aperture.
Figure 3C:
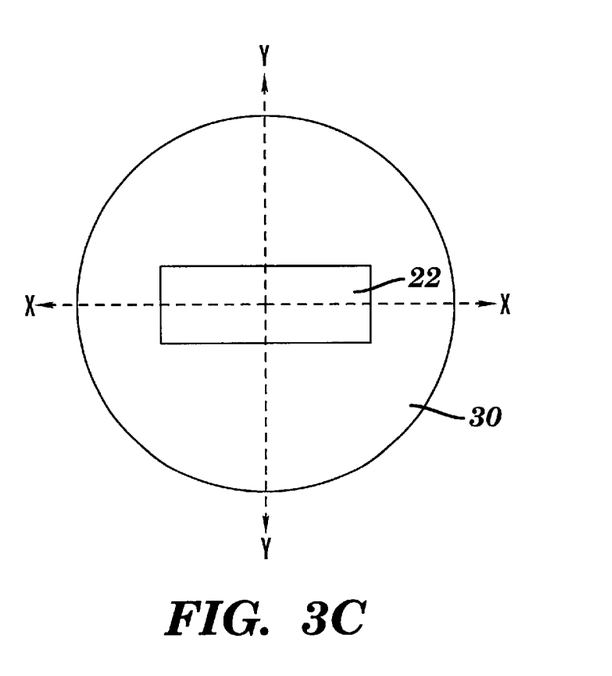
FIG. 3C is a front view of a condenser plate with a rectangular shaped aperture.

Referring to FIGS. 3A–3C, the illumination system 14 is positioned to direct illumination on to the mask 16 and then into an objective lens 18 and onto a substrate 25. In this particular embodiment, the illumination system includes a light source 15, a reflector 17, and a condenser lens 20 as described in greater detail below. The light source 15 and reflector 17 direct illumination towards the objective lens 18. Additionally in this particular embodiment, the condenser lens 20 is part of the illumination system 14, although the condenser lens 20 could be constructed to be separate from the illumination system 14, if needed or desired.

In this particular embodiment, the condenser lens 20 is a condenser lens system 20 which includes a mirror 19 that directs the illumination from light source 15 along the axis I—I and then redirects the illumination along the axis I—I through a pair of lens 21 and 23, through an aperture 22 in an aperture plate 30 located in a condenser lens pupil plane 26, through another lens 25, off of a mirror 27 and through a lens 29 along the redirected axis I—I onto at least a portion of the mask 16, although the condenser lens 20 could be made of other types and combination of one or more components in other configurations, such as a single lens, as needed or desired.

In this particular embodiment, the aperture plate 30 with the aperture 22 has four-sides which form the shape of a rectangle, although the sides 31, 33, 35, and 37 could be connected together to form other shapes, such as a square shape. The sides 31 and 35 of the aperture 22 are oriented in substantially the same direction as or substantially parallel to an x-axis and the sides 33 and 37 are oriented in substantially the same direction as or substantially parallel to a y-axis. The aperture plate 30 is positioned to be in alignment with the condenser lens pupil plane 26. A variety of different types of materials can be used to form the aperture plate 30. By way of example only, the plate 30 may be a metal or glass (fused silica) sheet with the aperture 22. The aperture 22 may be left open or may be filled with a translucent material. The user of the projection imaging system 10 can change the aperture plate 30 to adjust for different aperture sizes and shapes needed for specific feature types and/or sizes in different applications. By way of example only, an aperture plate 30 with a square shaped aperture 22 is shown in FIG.

3B and an aperture plate 30 with a rectangular shaped aperture 22 is shown in FIG. 3C. Although in these particular examples, the plates 30 have a circular outer shapes or envelopes, the plates 30 and 32 can have other outer shapes as long as they can be placed in the condenser lens pupil plane 26. Additionally, although in this particular embodiment the aperture 22 is formed in the aperture plate 30 which is located in the condenser lens pupil plane 26, other devices and/or techniques for forming the aperture 22 can also be used, such as forming the aperture 22 in a pupil plane of a lens which comprises the condenser lens 20.

The condenser lens 20 directs at least a portion of the illumination along the axis I—I, in this particular example, onto at least a portion of the mask 16. Since masks 16 which are used in lithographic applications are well known to those of ordinary skill in the art, they will not be discussed in detail here. In this particular embodiment, the mask 16 includes features 24 which are aligned along either an x-axis or direction (which again is identified as X—X in FIG. 3A) or a y-axis or direction (which again is identified as Y—Y in FIG. 3A). The x-axis extends in direction which is about ninety degrees offset from or substantially perpendicular to a direction for the y-axis. Illumination from the illumination system 14 passes through the condenser lens 20 and onto at least a portion of the features 24 of the mask 16.

The objective lens 18 is positioned after the mask 16 and directs the illumination passing through the features 24 in mask 16 onto the substrate 25. In this particular embodiment, the objective lens 18 comprises a single lens, although the objective lens can be made of multiple components arranged in differing configurations as needed or desired. With respect to the objective lens 18, minimum and balanced aberration performance is desired over the full objective lens 18 and maximum radial symmetry is targeted.

With respect to the condenser lens system 20, the aperture 22 in the aperture plate 30 is chosen for optimal illumination of mask geometry and distribution of diffraction information. The choice of partial coherence will depend on the projection imaging system 10 (its wavelength and numerical aperture), the feature size, and the requirement for DOF. In a two-dimensional situation, the degree of partial coherence is configured as $NA_c/NA_o$ where $NA_c$ is the condenser lens numerical aperture, $NA_o$ is the objective lens numerical aperture, and the ratio is known as the partial coherence factor, σ. Partial coherence is generally limited to a values of 0.8 or below, though values to 1.0 are possible. What the present invention has recognized is that there is flexibility in the choice of the shape of the aperture 22 as well as size if the ultimate goal is to maximize the efficiency of diffraction order collection. Since integrated circuit (IC) device geometry is often constrained to X/Y orientations (i.e. oriented in directions substantially parallel to either the x-axis or y-axis), the present invention recognized that there is a similar preferred X/Y character to the illumination system 10 via the aperture 22 in the condenser lens pupil plane 26.

For integrated circuit (IC) microlithography, feature orientation is generally limited to x-axis and y-axis (or 0 and 90°) with limited geometry at other angles. What the present invention recognizes is that apertures for this feature orientation would be optimized, if designed to take full advantage of this limited distribution of geometry. More specifically, when designing the pupil distribution for a condenser lens 20 (or correspondingly $NA_c$), a source shape for the aperture 22 should be chosen which places the highest degree of first order frequency information within the objective lens 18 as possible with the least amount of frequency averaging.

The frequency and spatial representations of square and circular pupils are often assumed to be equivalent. This is a convenient method of understanding the behavior of an optical imaging system 10, where a one-dimensional representation of a circular pupil is evaluated as a square function. Since only a circular pupil is radially symmetric, these functions, as well as their Fourier Transforms, are not equivalent. The two-dimensional fourier transform of a circularly symmetric function may be better evaluated by using the Hankel transform, which can be expressed as $$H(p;v)) = 2\pi \int h(r) J_v(2\pi pr) r dr$$

where J, is the nth order Bessel function, and r and p are radial coordinates in space and frequency domains. Properties of this transform are similar to the Fourier Transform. It is unique though in that it is also self-reciprocal. The Hankel transform of a circular pupil gives rise to what is commonly referred to as Besinc function, which when squared is also known as the Airy function:

$$\text{Airy function} = \left| Besinc(u) = \frac{2J_1(u)}{u} \right|^2$$

Figure 4A:
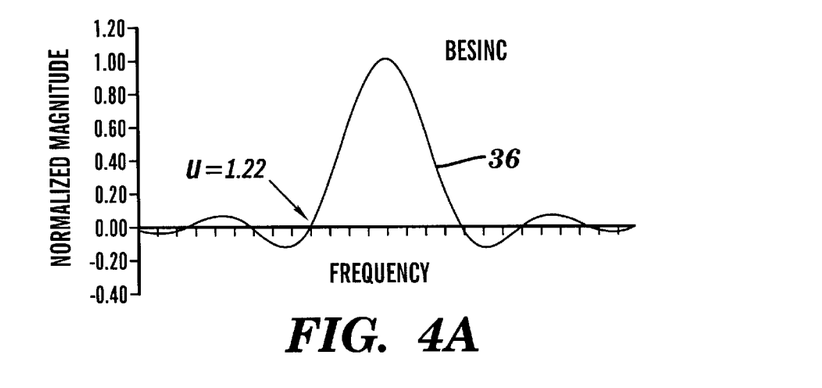
FIG. 4A is a graph illustrating a transform function of a circular shaped pupil.
Figure 4B:
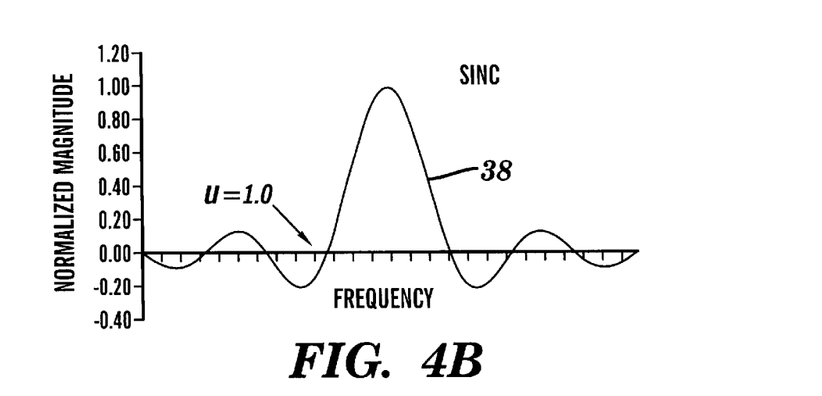
FIG. 4B is a graph illustrating a transform function of a square shaped pupil.

Circular and square pupil functions are not equivalent. Köhler illumination images a condenser lens pupil into the frequency plane of an objective lens 18. Circular and square shaped functions act to spread the frequency of diffraction orders in this plane. Their Fourier (or Hankel) transforms are shown in FIGS. 4A and 4B, respectively. The Optical Transfer Function (OTF) is a convolution of condenser lens and objective lens pupils. This translates in the image plane to the product of the Fourier Transform of the two pupils. When squared, this becomes the Point Spread Function (PSF), which is an indication of the "blur" a point image experiences in an otherwise perfect system. A system 10 that utilizes circular pupils has a PSF character with a $Sinc^2$ character while the PSF for a system with a circular objective pupil and a square illuminator pupil is proportional to the product of Besinc and Sinc functions 36 and 38. The potential improvement of using a square pupil is suggested here.

Referring to FIGS. 4A and 4B, more of the total area of a Besinc function 36 is contained in the region bounded by the first minima compared to that for a Sinc function 38. The impact on the PSF is an increased confinement, leading to potential improvements in imaging. Evaluation of the OTF for circular and for square pupils also indicates improvement.

Figure 5:
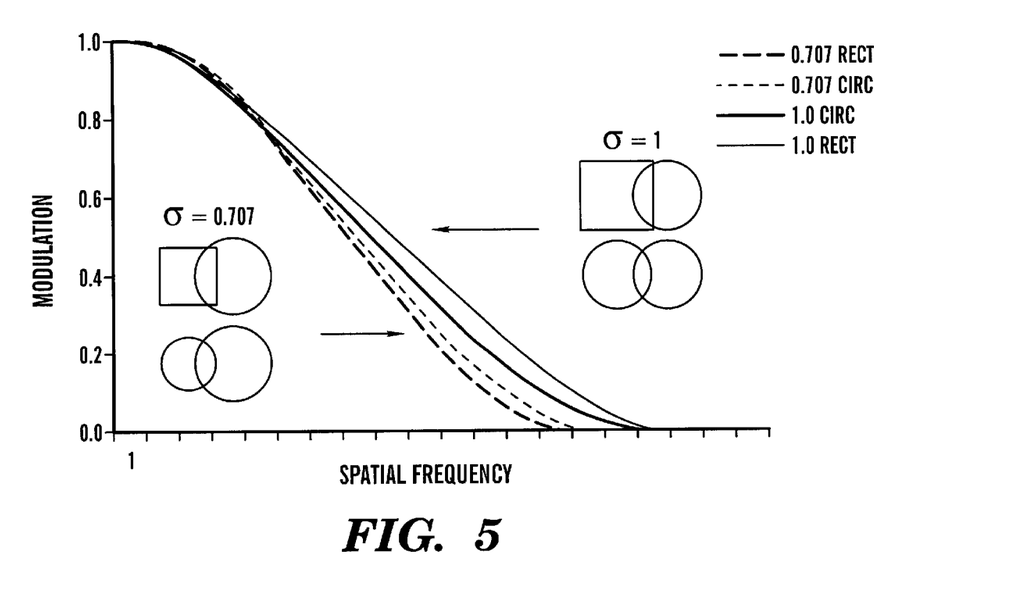
FIG. 5 is a graph illustrating an optical transfer function for square and circular pupils illuminating a circular objective lens pupil.

FIG. 5 shows modulation versus spatial frequency comparisons for square and circular illumination pupils combined with circular objective lens pupils. In one case, a circular illumination pupil with a corresponding σ value of 0.707 [or 1/sqrt.(2)] is compared to a square pupil measured with the same σ value half-width. This corresponds to the largest square shape that can fit into an illuminator pupil with maximum σ value of 1.0. The performance of the square pupil dominates at all frequencies. A comparison is also made for full σ=1 pupils. The performance of this circular pupil also appears inferior to the square pupil.

Figure 6A:
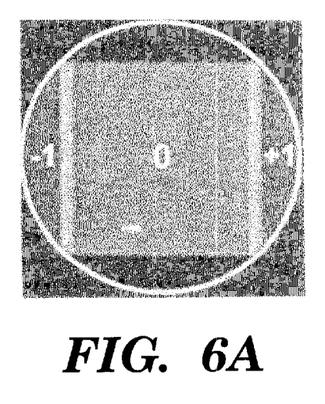
FIG. 6A is a diagram illustrating frequency distribution of diffraction orders in an objective lens for square shaped illumination.
Figure 6B:
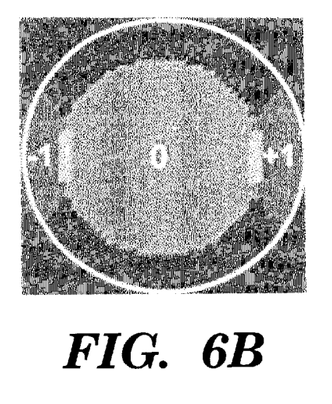
FIG. 6B is a diagram illustrating frequency distribution of diffraction orders in an objective lens for circular shaped illumination.

FIGS. 6A and 6B demonstrate the situation from a spatial frequency perspective. In this particular example, the objective lens pupil 28 is filled by diffraction orders from a mask 16 with features 24 corresponding to a $k_1$ factor near 0.35. Circular and square shapes are compared in these figures. For both situations, the objective lens 18 collects all of the zero diffraction order and part of the first orders. The spread of the first orders is determined by the illuminator pupil size and shape. Although the collection of the first diffraction order on the spatial frequency axis is equivalent in both cases, the total "area" of the first order collected for the square pupil case shown in FIG. 6A is larger than for the circular shape shown in FIG. 6B for X/Y oriented features. This improvement is lithographically significant.

Figure 7:
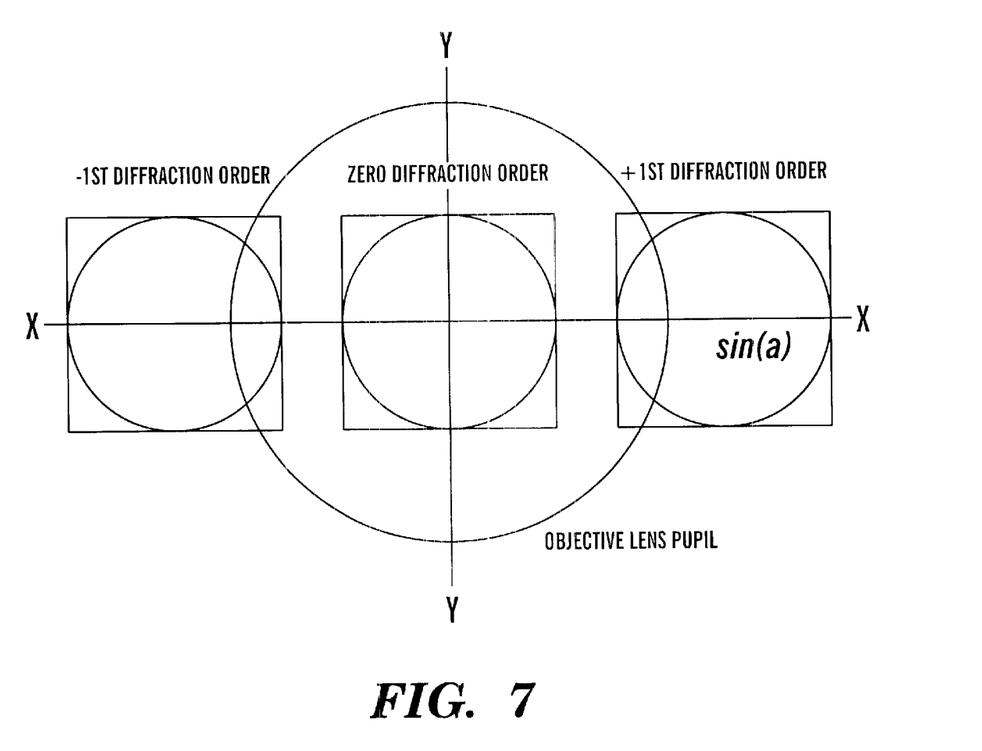
FIG. 7 is a diagram illustrating a comparison of square aperture illumination of dense x-oriented features to circular illumination features.

Referring to FIG. 7, a diagram is illustrated which compares the information captured in the objective lens 18 for a circular shaped aperture and a square shaped aperture 22 of the same width. In the case of the square shaped aperture 22, less frequency averaging (or spreading) is required to place first order frequency information in the objective lens 18 than for a circular shaped aperture. To match the square shaped aperture 22 situation with a circular shaped aperture, a higher degree of partial coherence would be needed, resulting in an increase in degradation as diffraction orders are spread.

Figure 8:
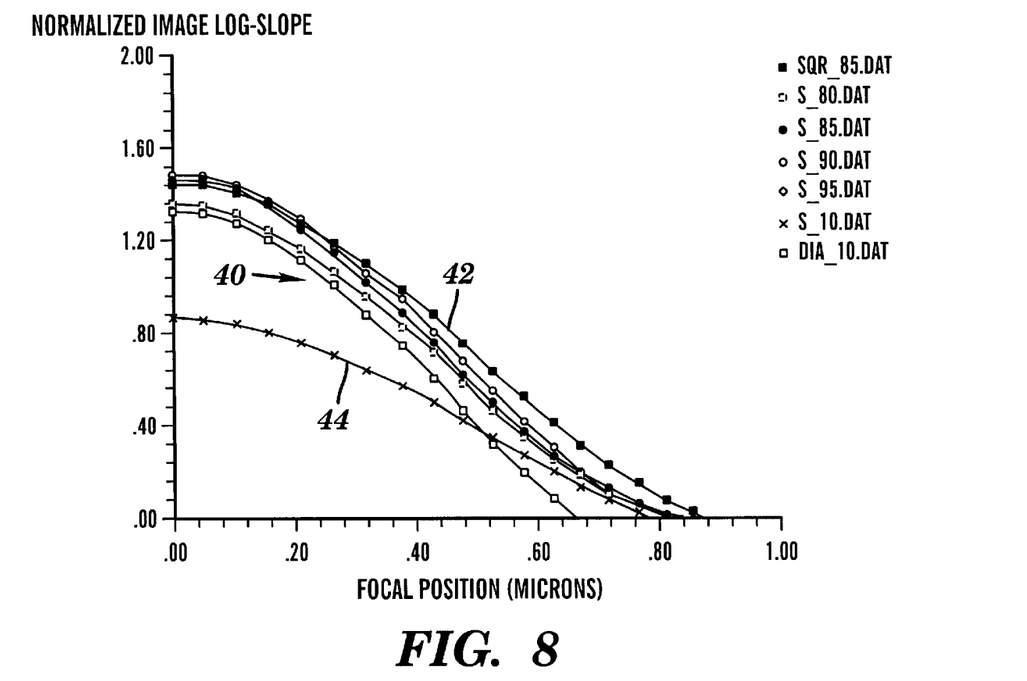
FIG. 8 is a graph illustrating a comparison of imaging performance or normalized image log-slope (NILS) for circular apertures with a partial coherence equal to 0.80, 0.85, 0.90, 0.95, and 1.0 to a square aperture with a partial coherence equal to 0.85, and a diamond aperture with a partial coherence equal to 1.0.

Referring to FIG. 8, this graph shows how no condition of partial coherence using a circular shaped aperture can match the performance of a square shaped aperture 22. In this graph, dense, equal 0.12 µm lines 40 imaged using circular shaped apertures with σ values corresponding to 0.80, 0.85, 0.90, 0.95, and 1.0 and a line 42 imaged using an optimized square aperture 22 with an effective σ of 0.85 are shown. Normalized image log slope (NILS=CD×ILS) is plotted as a function of focal position. A similar analysis for a line 44 imaged using diamond shaped aperture, whose sides are not in alignment with the x-axis or y-axis, leads to decreased performance over a circular shaped aperture, is also shown.

Figure 9:
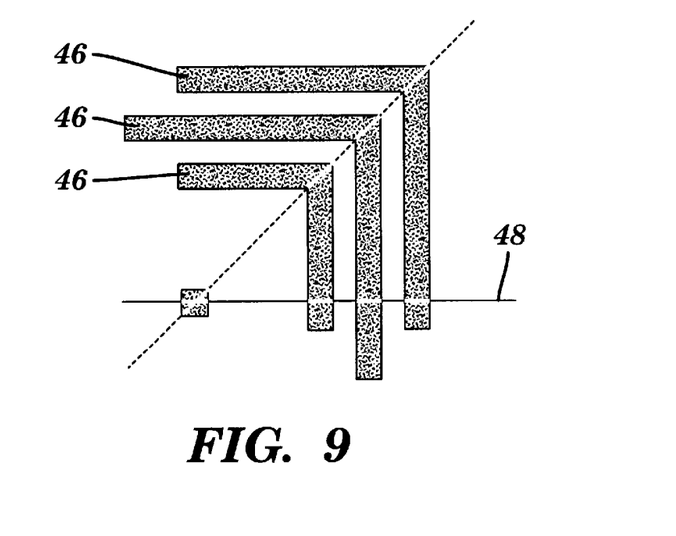
FIG. 9 is a diagram of a two dimensional mask.

To further evaluate the performance potential of square shaped illumination with the square shaped aperture 22, aerial image simulation has been performed using a high NA scalar model. In this particular example, a three bar elbow pattern 46 shown in FIG. 9 was evaluated. In this example, the imaging situation studied utilized a 248 nm wavelength, a 0.60 NA objective lens, and 160 nm line features using various illumination conditions. Comparisons of circular and square illumination shapes were made through measurement of aerial images, using aerial image intensity and normalized image log slope (NILS). Image orientations along X/Y and 45 degree directions were included.

Figure 10A:
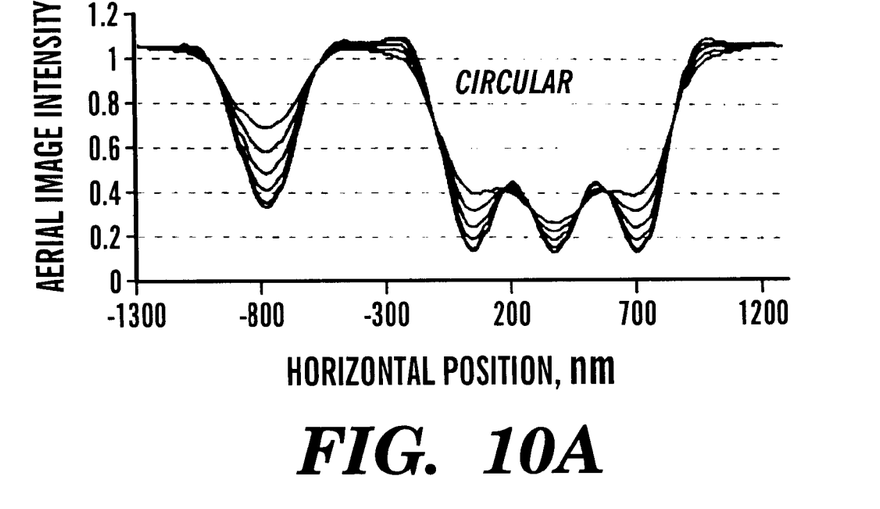
FIG. 10A is a graph of aerial image intensity versus horizontal position for a circular source shape for a horizontal cut line through the elbow pattern shown in FIG. 9.
Figure 10B:
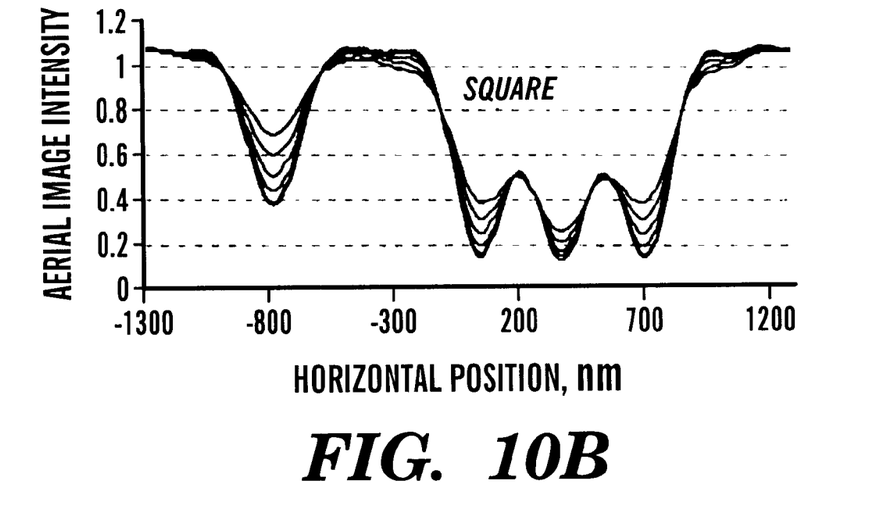
FIG. 10B is a graph of aerial image intensity versus horizontal position for a square source shape for a horizontal cut line through the elbow pattern shown in FIG. 9.

Referring to FIGS. 10A and 10B, a comparison of the aerial images along horizontal or x-axis cut line for circular and square illuminator shapes with σ values of 0.70 is shown. Images were generated through 0.5 micron of defocus. As illustrated in these graphs, the use of the square shaped pupil with a square shaped aperture 22 leads not only to improved performance for features at best focus, but also as defocus is considered. The impact is greatest for central grouped features, as would be expected by considering the distribution of the diffraction field.

As the above examples illustrate, the use of apertures 22 in accordance with the present invention, such as a square shaped aperture 22 or a rectangular shaped aperture 22 in alignment with the x-axis and y-axis, take advantage of IC geometry oriented on X/Y directions. Square illumination approaches have been shown to offer significant improvement over circular illumination approaches at relatively low cost.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. An imaging tool for use with a mask with features oriented along at least an x-axis or a y-axis, the x-axis extending in directions substantially perpendicular to the directions of the y-axis, the tool comprising a condenser lens with a condenser aperture having four-sides and located in a condenser lens pupil plane, the sides of the condenser aperture oriented in substantially the same direction as either the x-axis or the y-axis, the condenser lens positioned to place at least a portion of any illumination on at least a portion of the mask.

2. The tool as set forth in claim 1 wherein the four-sides of the condenser aperture form a square shape.

3. The tool as set forth in claim 1 wherein the four-sides of the condenser aperture form a rectangular shape.

4. The tool as set forth in claim 1 further comprising a condenser plate located in the condenser lens pupil plane, the condenser lens aperture located in the condenser plate.

5. A projection imaging system comprising:

a mask with features oriented along at least an x-axis or a y-axis, the x-axis extending in directions substantially perpendicular to the directions of the y-axis;

a condenser lens with a condenser aperture having four-sides and located in a condenser lens pupil plane, the sides of the condenser aperture oriented in substantially the same direction as either the x-axis or the y-axis; and an illuminator which illuminates at least a portion of the condenser lens through the condenser aperture onto at least a portion of the mask.

6. The system as set forth in claim 5 wherein the four-sides of the condenser aperture form a square shape.

7. The system as set forth in claim 5 wherein the four-sides of the condenser aperture form a rectangular shape.

8. The system as set forth in claim 5 further comprising a condenser plate located in the condenser lens pupil plane, the condenser lens aperture located in the condenser plate.

9. A method for lithography comprising:

illuminating at least a portion of a condenser lens pupil plane of a condenser lens; and directing at least a portion of the illumination passing through the condenser lens onto at least a portion of a mask, wherein the mask has features oriented along at least an x-axis or y-axis, the x-axis extending in directions substantially perpendicular to the directions of the y-axis, and the condenser lens has a condenser aperture located in the condenser lens pupil plane, the condenser aperture having four-sides, each of the sides of the condenser aperture oriented in substantially the same direction as either the x-axis or the y-axis.

10. The method as set forth in claim 9 wherein the four-sides of the condenser aperture form a square shape.

11. The method as set forth in claim 9 wherein the four-sides of the condenser aperture form a rectangular shape.

12. The method as set forth in claim 9 further comprising a condenser plate located in the condenser lens pupil plane, the condenser lens aperture located in the condenser plate.

13. An imaging tool for use with a mask with features oriented along at least an x-axis or a y-axis, the x-axis extending in directions substantially perpendicular to the directions of the y-axis, the tool comprising a condenser lens with a non-circular condenser aperture having multiple sides and located in a condenser lens pupil plane, at least one of the sides of the condenser aperture oriented in substantially the same direction as either the x-axis or the y-axis.

14. The tool as set forth in claim 13 wherein the multiple sides of the condenser aperture form a square shape.

15. The tool as set forth in claim 13 wherein the multiple sides of the condenser aperture form a rectangular shape.

16. The tool as set forth in claim 13 further comprising a condenser plate located in the condenser lens pupil plane, the condenser lens aperture located in the condenser plate.

17. A projection imaging system comprising:
   a mask with features oriented along at least an x-axis or a y-axis, the x-axis extending in directions substantially perpendicular to the directions of the y-axis;
   a condenser lens with a non-circular condenser aperture having multiple sides and located in a condenser lens pupil plane, at least one of the sides of the condenser aperture oriented in substantially the same direction as either the x-axis or the y-axis; and
   an illuminator which illuminates at least a portion of the condenser lens through the condenser aperture onto at least a portion of the mask.

18. The system as set forth in claim 17 wherein the multiple sides of the condenser aperture form a square shape.

19. The system as set forth in claim 17 wherein the multiple sides of the condenser aperture form a rectangular shape.

20. The system as set forth in claim 17 further comprising a condenser plate located in the condenser lens pupil plane, the condenser lens aperture located in the condenser plate.

21. A method for lithography comprising:
   illuminating at least a portion of a condenser lens pupil plane of a condenser lens; and
   directing at least a portion of the illumination passing through the condenser lens onto at least a portion of a mask, wherein the mask has features oriented along at least an x-axis or y-axis, the x-axis extending in directions substantially perpendicular to the directions of the y-axis, and the condenser lens has a non-circular condenser aperture located in the condenser lens pupil plane, the condenser aperture having multiple sides, at least one of the sides of the condenser aperture oriented in substantially the same direction as either the x-axis or the y-axis.

22. The method as set forth in claim 21 wherein the multiple sides of the condenser aperture form a square shape.

23. The method as set forth in claim 21 wherein the multiple sides of the condenser aperture form a rectangular shape.

24. The method as set forth in claim 21 further comprising a condenser plate located in the condenser lens pupil plane, the condenser lens aperture located in the condenser plate.

* * * * *